US010608419B2

(12) United States Patent
Bach

(10) Patent No.: US 10,608,419 B2
(45) Date of Patent: Mar. 31, 2020

(54) SWITCHGEAR CABINET OR RACK FOR ACCOMMODATING ELECTRICAL ENERGY STORES, IN PARTICULAR BATTERIES, AND A CORRESPONDING SWITCHGEAR CABINET ASSEMBLY OR RACK ASSEMBLY

(71) Applicant: RITTAL GMBH & CO. KG, Herborn (DE)

(72) Inventor: Michael Bach, Siegbach (DE)

(73) Assignee: RITTAL GMBH & CO. KG (DE)

( * ) Notice: Subject to any disclaimer, the term of this patent is extended or adjusted under 35 U.S.C. 154(b) by 162 days.

(21) Appl. No.: 15/563,531

(22) PCT Filed: Apr. 5, 2016

(86) PCT No.: PCT/DE2016/100158
§ 371 (c)(1),
(2) Date: Sep. 29, 2017

(87) PCT Pub. No.: WO2016/162018
PCT Pub. Date: Oct. 13, 2016

(65) Prior Publication Data
US 2018/0109081 A1    Apr. 19, 2018

(30) Foreign Application Priority Data

Apr. 10, 2015   (DE) ..................... 10 2015 105 482

(51) Int. Cl.
*H02B 1/32*      (2006.01)
*H05K 7/18*      (2006.01)
(Continued)

(52) U.S. Cl.
CPC ............ *H02B 1/32* (2013.01); *H01M 2/1016* (2013.01); *H01M 2/1077* (2013.01);
(Continued)

(58) Field of Classification Search
CPC .......... H02B 1/32; H02B 1/34; H05K 5/0021; H05K 7/14; H05K 7/1418;
(Continued)

(56) References Cited

U.S. PATENT DOCUMENTS 5,277,615 A * 1/1994 Hastings ................. G06F 1/181
361/679.32
5,467,254 A * 11/1995 Brusati ............... H05K 7/1409
174/355
(Continued)

FOREIGN PATENT DOCUMENTS

CN    104282857       1/2015
DE    102004047360 A1   12/2005
(Continued)

OTHER PUBLICATIONS

International Search Report (in English and German) and Written Opinion of the International Searching Authority issued in PCT/DE2016/100158, dated Aug. 24, 2016 ISA/EPO Rijswijk.
(Continued)

*Primary Examiner* — Robert J Hoffberg
(74) *Attorney, Agent, or Firm* — Harness, Dickey & Pierce, P.L.C.

(57) ABSTRACT

The invention relates to a switch cabinet or rack or rack for receiving electrical energy storage units, in particular batteries, whereby the switch cabinet or the rack has a plurality of energy storage unit slots arranged above one another, so characterized in that the energy storage unit slots are formed by a plurality of grooves, whose longitudinal and slide-in direction extends in the depth direction of the switch cabinet or rack, whereby in each case a pair of grooves are set up on the opposite lying sides of the switch cabinet or rack at the same vertical height and with their open longitudinal side directed toward one another.

13 Claims, 3 Drawing Sheets

Figure 1:
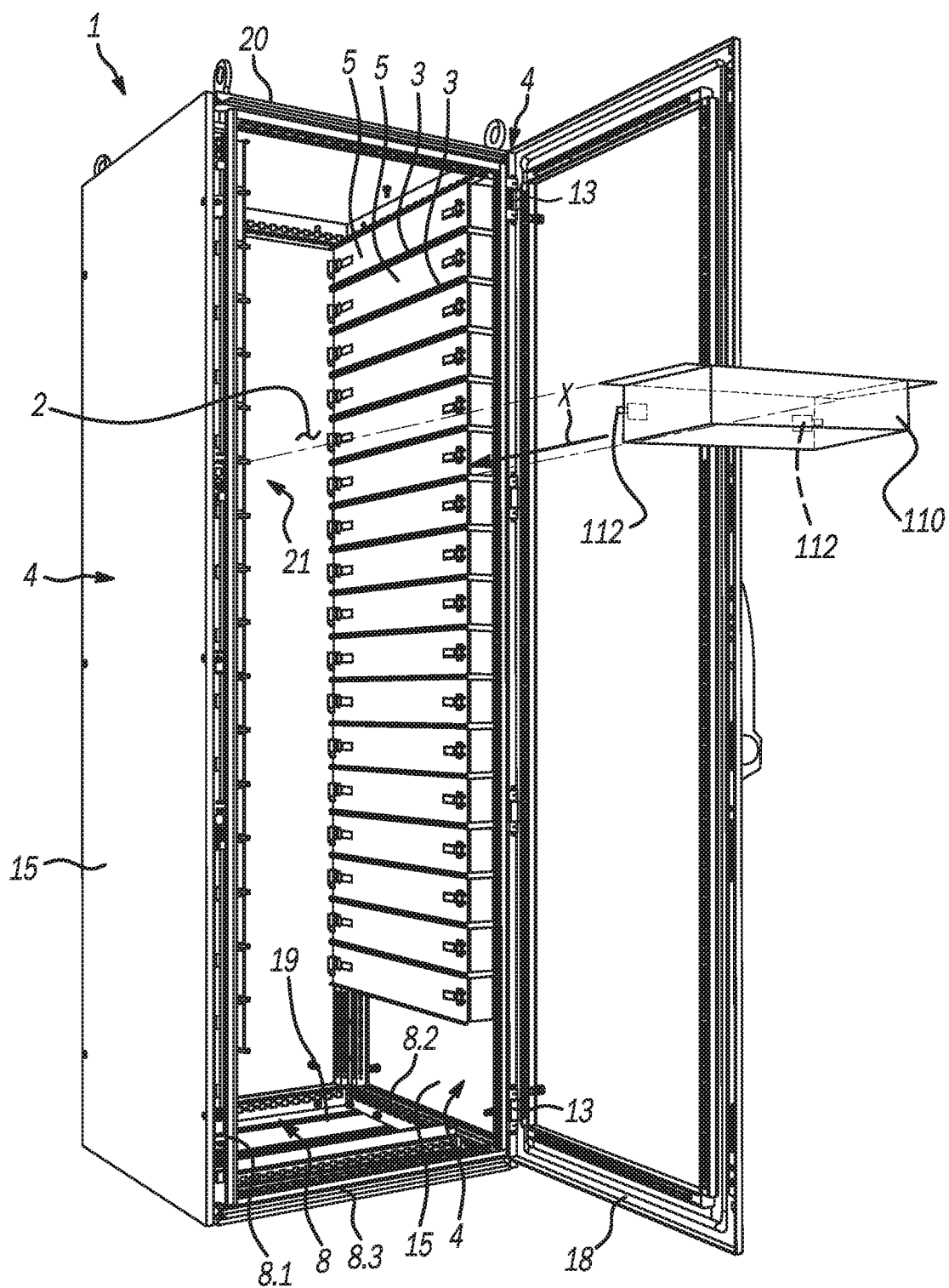

(51) Int. Cl.
  *H05K 5/04* (2006.01)
  *H01M 2/10* (2006.01)
  *H02B 1/30* (2006.01)

(52) U.S. Cl.
  CPC ............... *H02B 1/301* (2013.01); *H05K 5/04* (2013.01); *H05K 7/18* (2013.01)

(58) Field of Classification Search
  CPC ..... H05K 7/1438–1439; H05K 7/1457; H05K 7/1474; H05K 7/1492; H05K 7/183; H01M 2/1077
  See application file for complete search history.

(56) References Cited

U.S. PATENT DOCUMENTS

| | | | | |
|---|---|---|---|---|
| 6,088,222 | A * | 7/2000 | Schmitt | E05B 63/143 312/332.1 |
| 6,619,766 | B1 * | 9/2003 | Mansueto | G06F 1/184 312/223.1 |
| 6,780,030 | B2 * | 8/2004 | Yoshinaga | H01R 13/6582 439/92 |
| 7,021,729 | B2 * | 4/2006 | Mansueto | G06F 1/184 312/223.1 |
| 7,320,615 | B2 * | 1/2008 | Fang | H05K 7/1418 439/377 |
| 7,511,970 | B2 * | 3/2009 | Justason | G06F 1/182 361/818 |
| 7,576,993 | B2 * | 8/2009 | Hsieh | H05K 9/0016 361/728 |
| 8,047,383 | B2 * | 11/2011 | Hendrix | H05K 7/1425 211/26 |
| 8,083,400 | B2 * | 12/2011 | Sosedov | G06F 1/20 361/748 |
| 8,900,737 | B2 | 12/2014 | Kim et al. | |
| 9,497,889 | B2 * | 11/2016 | Wright | H05K 7/2039 |
| 2005/0236944 | A1 | 10/2005 | Nakayama | |
| 2006/0028171 | A1 | 2/2006 | Marraffa | |
| 2015/0333303 | A1 | 11/2015 | Hachiya et al. | |
| 2016/0278243 | A1 | 9/2016 | Bach et al. | |

FOREIGN PATENT DOCUMENTS

| | | |
|---|---|---|
| DE | 202009005875 U1 | 10/2009 |
| DE | 202010004681 U1 | 7/2010 |
| EP | 1462813 A2 | 9/2004 |
| EP | 1355404 B1 | 5/2007 |
| EP | 2731166 A1 | 5/2014 |
| JP | H08-214416 | 8/1996 |
| JP | 2010-055973 A | 3/2010 |
| KR | 20020075084 A * | 10/2002 |
| KR | 10-2014-0061212 A | 5/2014 |
| WO | WO-02/27817 A1 | 4/2002 |
| WO | WO-03019703 A1 | 3/2003 |
| WO | WO-2005074097 A2 | 8/2005 |
| WO | WO 2014/073544 A1 | 5/2014 |

OTHER PUBLICATIONS

International Preliminary Report on Patentability (Chapter II of the Patent Cooperation Treaty), date of completion Mar. 31, 2017; IPEA/EP.

* cited by examiner

SWITCHGEAR CABINET OR RACK FOR ACCOMMODATING ELECTRICAL ENERGY STORES, IN PARTICULAR BATTERIES, AND A CORRESPONDING SWITCHGEAR CABINET ASSEMBLY OR RACK ASSEMBLY

CROSS-REFERENCE TO RELATED APPLICATIONS

This application is a 371 U.S. National Stage of International Application No. PCT/DE2016/100158, filed on Apr. 5, 2016, which claims priority to German Application 10 2015 105 482.5, filed on Apr. 10, 2015. The entire disclosures of the above applications are incorporated herein by reference.

FIELD

The invention relates to a switch cabinet or rack for holding electrical energy storage units, in particular batteries, whereby the switch cabinet or the rack has a plurality of energy storage unit slide-in slots arranged above one another.

An example of such a storage cabinet is known from U.S. Pat. No. 8,900,737 B2. This has a plurality of sections separated from each other by separating trays, in which in each case electrical energy storage units may be held. A similar switch cabinet is revealed by EP 1 462 813 A2, EP 1 355 404 B1, EP 2 731 166 A1, WO 03/019703 A1, WO 2005/074097 A2, and WO 02/027817 A1.

BACKGROUND

This section provides background information related to the present disclosure which is not necessarily prior art.

The known switch cabinets have the disadvantage that they are formed in a comparatively expensive manner because of the use of separating trays to separate the sections, whereby the separating trays themselves take up room on the inside of the switch cabinet, which as a result cannot be used for holding electrical energy storage units.

SUMMARY

This section provides a general summary of the disclosure, and is not a comprehensive disclosure of its full scope or all of its features.

It is therefore the task of the invention to further develop the switch cabinet of the type mentioned in the introduction that with the simplest possible technical means also allows the holding of a very densely packed plurality of electrical energy storage units.

Accordingly in a switch cabinet or rack the energy memory unit slide-in slots are formed from a plurality of grooves whose length and slide-in depth direction stretch into the switch cabinet or rack, whereby in each case a pair of grooves is set to the opposite sides of the switch cabinet or rack at the same vertical height and with their lengthwise sides open. By preparing grooves to hold the energy storage units on the inside of the switch cabinet or the rack, one may also dispense with the use of separating trays and similar items, so that as a result the room formerly taken up by these is saved, and correspondingly the density of packing of the energy storage units on the inside of the switch cabinet or rack is increased.

The energy storage unit slide-in modules may be formed by a plurality of mounting chassis mounted vertically above one another on the opposite sides of the switch cabinet or rack; these are mounted vertically separated from one another at a distance that sets a vertical groove width perpendicular to the slide-in direction.

In this way the mounting chassis may have a beveled flange that in the depth direction extends parallel to the longitudinal sides in the direction of the particular opposite side of the switch cabinet or rack.

Each pair of beveled units may be set up at the same vertical height of the mounting chassis lying opposite, whereby in each case one of the grooves between the beveled unit flanges is set directly above the following beveled unit flanges.

Furthermore, the switch cabinet or the rack may have a frame structure with four equally long vertical ledges and four equally long depth edges, of which in each case two vertical ledges and two depth ledges are connected to a rectangular frame. The frames in each case form the sides of the switch cabinet or rack lying opposite each other, whereby the vertical ledges have on a mounting side a system of holes made of regularly separated mounting recesses, and whereby the mounting chassis are connected on opposite lying ends in each case with one of the vertical ledges of one of the rectangular frames.

To achieve a simple ground contact it can be provided that the energy storage unit slide-in slots in each case have a ground connection on the back end of their slide-in direction, which contacts a ground contact of an energy storage unit if the appropriate energy storage unit is in a completely slid-in position.

The ground connection may thereby have an electrically conducting contact plate with a fastening section, through which the contact plate is electrically conducted to one of the mounting chassis, whereby the contact plate also has a free end, which is mechanically bootable through the opposite fastening section and which has at least one contact claw for an electrical contact of the ground contact of the energy storage unit.

For a precise definition of a completely slid-in position of an energy storage unit in one of the energy storage units slide-in slots and thus for securing the electric contact between the ground contact of the energy storage unit and the ground connection, it can be planned that the energy storage unit slide-in slots each have a pause position, which sets a completely slid-in position of an energy storage unit, whereby in the pause position the free end of the contact plate abuts against the mechanically bootable energy storage unit via the at least one contact claw to the ground contact of the energy storage unit.

Thereby it can also be provided that the switch cabinet or the rack has an electric conducting frame structure, to which the electrically conducting energy storage unit slots are also mounted and electrically contacted, in particular the mounting chassis that forms the energy storage unit slide-in slots, whereby the contact connections are electrically contacted with the energy storage slide-in slots, in particular with the mounting chassis.

Thereby it may be advantageous for the frame to be made of lacquered, electrically conducting ledges or of unlacquered, electrically conducting coated ledges, particular galvanized ones.

The switch cabinet or rack setup can accordingly have a switch cabinet or a rack of the type described above and a plurality of electrical energy storage units, whereby the electrical energy storage units have a fastening flange in each case extending to opposite sides lying in the depth direction of the energy storage units, through which the electrical storage units in each case are inserted into the energy storage unit slots in a pair of opposite lying grooves that are located on the same vertical height.

Thereby the energy storage units may have a horizontal width without any consideration of the fastening flange, which essentially corresponds to the very slight width of the energy storage unit slide-in modules, whereby the energy storage units have a vertical height that essentially corresponds to the vertical interval of the grooves, so that as a result a maximum density of packing is achieved in the vertical and horizontal directions.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
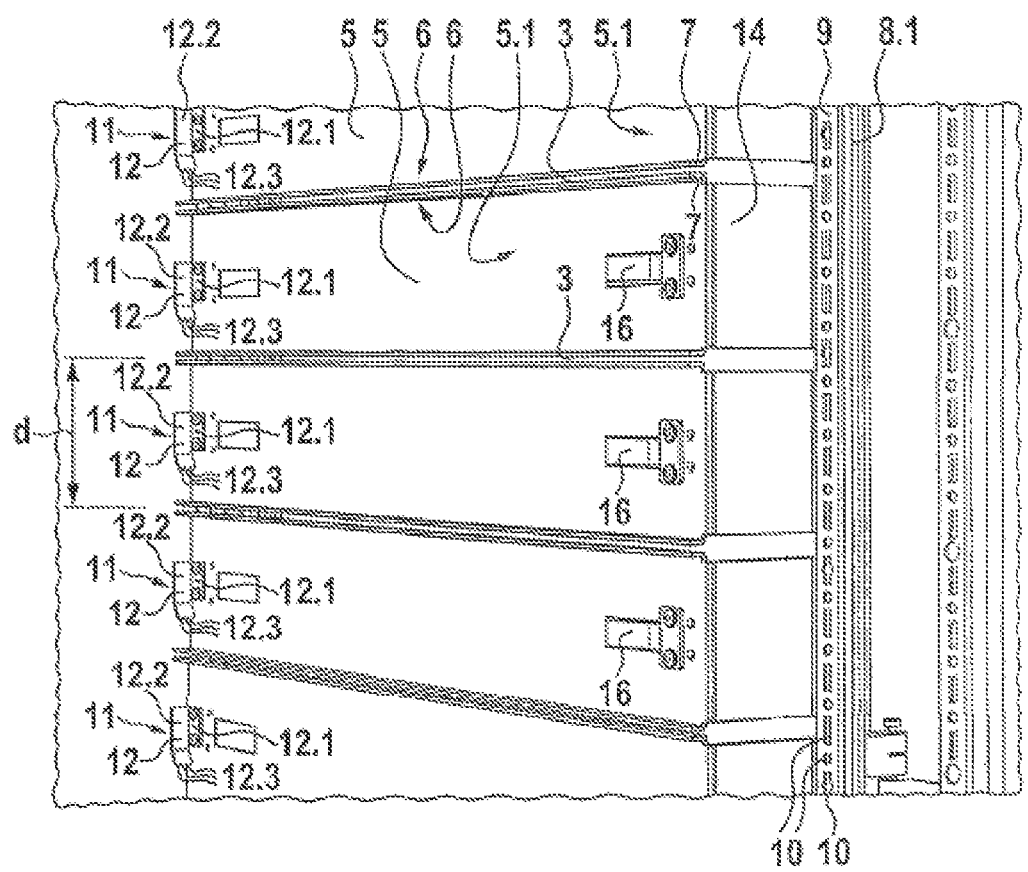
Figure 3:
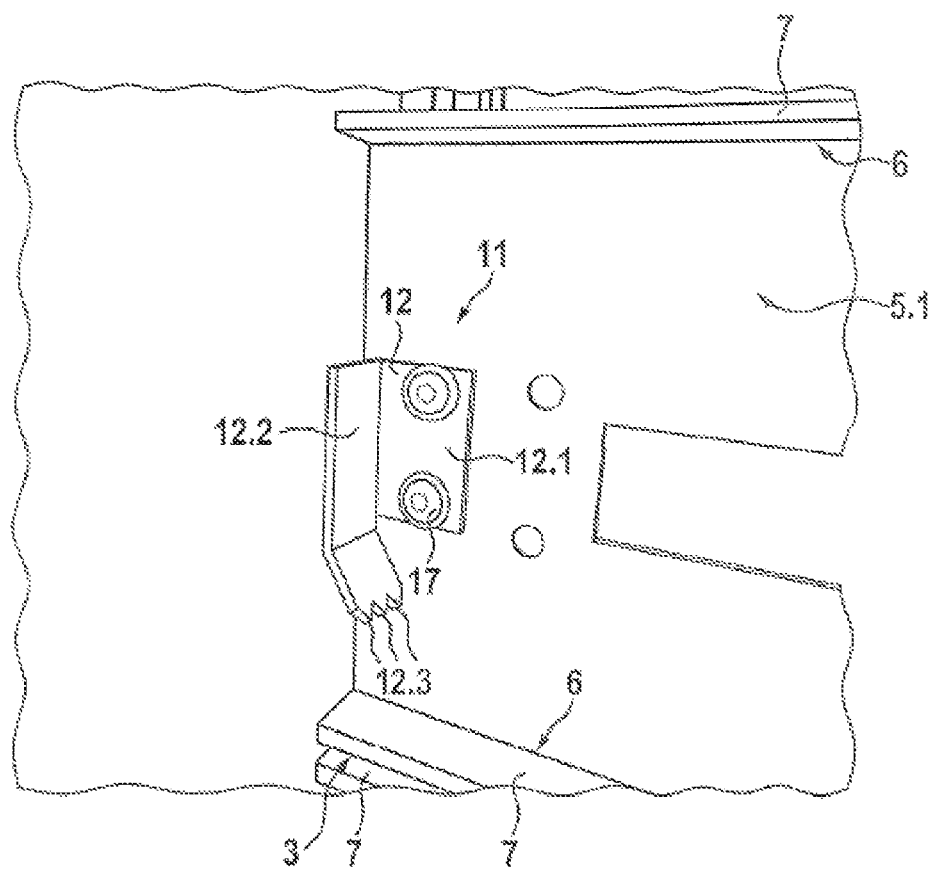

Further details of the invention are discussed on the basis of the figures below. These show:

FIG. 1 A switch cabinet in perspective presentation according to one embodiment of the invention;

FIG. 2 A detailed view of the switch cabinet according to FIG. 1, which better shows the energy storage unit slide-in slots; and FIG. 3 A detailed view of the contact connection of the embodiment according to FIGS. 1 and 2.

DETAILED DESCRIPTION

Example embodiments will now be described more fully with reference to the accompanying drawings.

FIG. 1 shows a switch cabinet 1 according to one embodiment of the invention. The switch cabinet 1 has a frame structure 8, which is made of four vertical ledges 8.1 and four horizontal or width ledges 8.3. At each of the eight corner points of the frame 8, there come together at a right angle to each other a vertical ledge 8.1, a depth ledge 8.2, and a width ledge 8.3. The frame structure is clad in each case with a side piece 15, one on each facing side 4. On the bottom the frame structure 8 is clad with a floor pan 19, on the top with a covering element 20, and behind with a back wall 21. A switch cabinet door 18 is fastened to be swingable on the front side to the frame 8 using hinges 13.

On the opposite sides 4 of the switch cabinet 1 on the inside on the side walls 15 in each case is a plurality of mounting chassis 5 mounted vertically above one another, which with the grooves 3 form between them a plurality of energy storage unit slide-in slots 2, through which the energy storage units can be slid in from the door side front side of the switch cabinet 1 in the depth direction x of the switch cabinet.

The energy storage unit slide-in slots 2 formed by the mounting chassis 5 are shown more closely in FIG. 2. FIG. 2 allows one to see that the mounting chassis 5 have a beveled unit flange 7 on the longitudinal sides 6 stretching in the lengthwise direction, whereby an interval is created between the chassis 5 vertically adjacent to unit flanges, which forms precisely the groove 3 for the slide-in of the energy storage unit.

The mounting chassis are formed essentially as parts of metal plates, whereby a central section 5.1, which is arranged parallel to the sides 4 of the switch cabinet 1 (cf. FIG. 1), above the end side supporting sections 14 in the lengthwise direction, which are beveled by the central section 5.1, is attached to the vertical ridges 8.1. The vertical ridges 8.1 for this have a mounting side 9 with a system of holes 10 of regularly separated mounting recesses. It is in particular planned that the mounting chassis 5 be a piece of metal plate made of electrically conducting material, whereby the mounting chassis 5 continues to be attached as an electrical conductor to the vertical ledges 8.1, and that the vertical ledges 8.1 are electrically conducting, so that an electric conducting connection is created between the mounting chassis 5 and the frame 8 of the switch cabinet 1.

The unit flanges 7 are beveled from the central section 5.1 on the longitudinal sides 6 of the central section 5.1, which with their free end extend into the interior of the switch cabinet and in the direction of the mounting chassis 5 that lies opposite. In this way the adjacent unit flanges 7 in the vertical direction of the mounting chassis 5 directly above one another form a groove for the insertion of an electric energy storage unit 110. A pause element 16 is set up as a clamp on one of the front ends of the central section 5.1 in the insertion direction, with the support of which a pause position of the energy storage unit 110 can be set, in which the energy storage unit 110 is in the completely slid-in position and is thus secured against an undesired shove in the slide-in direction x.

The pause element 16 is designed for mounting and disassembly without tools of the battery slide-in slots, for which the clamp has a leading angle piece, which moves over into a pause projecting element, which through pressure on the leading angle piece can be bootable out of its closing position into a release position. Upon sliding in of an energy storage module, the leading angle piece is pressed in from a side wall of the energy storage module, so that the pause projecting element can be brought forward to the side wall. If the energy storage module achieves its end position or pause position, the clamp can move into the closing position based on its bootable state, in which the bootable pause item can be grasped in a corresponding recess in the side wall of the energy storage module and the energy storage module can be set. For again releasing the energy storage module, the leading angle pieces of the clamp can be activated manually in order to transfer the bootable pause from the closing position to the release position.

A ground connection 11 is set up on the opposite, backside end of the central section 5.1 of the mounting chassis 5. This is presented more closely in FIG. 3. The ground connection 11 accordingly has an electric conducting contact plate 12, which is fastened with a fastening section 12.1 to the central section 5.1 of the mounting chassis. In the embodiment according to FIG. 3, this occurs using two rivets 17. It is however suitable for any other fastening means that is suitable for an electric conducting connection of the ground connection 11 to the central section 5.1 of the mounting chassis 5. A free end 12.2 of the contact plate 12 extends from the fastening section 12.1, which is mechanically bootable opposite the fastening section 12.1 and which has three contact claws 12.3 for electrical contact of a ground contact of an energy storage unit 110.

The contact plate 12 can be formed as a simple metal form section. Thereby the position of the free end 12.2, in particular the contact claws 12.3, is laid out in a way that the contact claws 12.3 in the fully slid-in status of an electric energy storage unit 110 are mechanically bootable and contact the ground contact 112 of the energy storage unit 110.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switch cabinet or rack for receiving electrical energy storage units, the switch cabinet or rack comprising:
   a plurality of mounting chassis arranged in a first column and a second column spaced apart from the first column,
   each one of the first column and the second column includes multiple mounting chassis of the plurality of mounting chassis spaced apart vertically to define grooves therebetween,
   a plurality of energy storage unit slots, each one of the multiple mounting chassis of the first column is opposite to a different one of the multiple mounting chassis of the second column to define a representative one of the plurality of energy storage unit slots therebetween,
   each one of the plurality of energy storage unit slots is configured to receive one of the electrical energy storage units therein,
   a longitudinal and slide-in direction of the grooves extends in a depth direction of the switch cabinet or rack, and whereby in each case, a pair of the grooves is set up on opposite lying sides of the switch cabinet or rack at a same vertical height and each of the pair of grooves having an open longitudinal side directed toward one another,
   each one of the plurality of mounting chassis has each have a slot ground contact in a back end thereof in the slide-in direction, which is configured to contact a unit ground contact of the one of the electrical energy storage units, whenever the one of the electrical energy storage units is in a completely slid-in position, whereby the switch cabinet or rack also has an electric conducting frame structure, to which the plurality of mounting chassis forming the energy storage unit slots are assembled and electrically contacted, whereby each slot ground contact is in electrical contact with the plurality of mounting chassis.

2. The switch cabinet or rack according to claim 1, in which the grooves are formed on a plurality of sides of the switch cabinet or rack and the grooves are arranged vertically above one another, the plurality of mounting chassis are mounted at a vertical distance from one another that determines a width of each of the grooves, the width of each of the grooves being perpendicular to the slide-in direction.

3. The switch cabinet or rack according to claim 2, wherein a beveled unit flange extends in the depth direction on each of parallel longitudinal sides of each of the plurality of mounting chassis, the beveled unit flange extends in a direction of a particular one of opposite lying sides of the switch cabinet or rack.

4. The switch cabinet or rack according to claim 3, wherein each of the grooves is formed by a pair of beveled unit flanges, the pair of beveled unit flanges including the beveled unit flange on an upper one of the longitudinal sides of one of the plurality of mounting chassis and the beveled unit flange on a lower one of the longitudinal sides of another one of the plurality of mounting chassis disposed directly above the one of the plurality of mounting chassis.

5. The switch cabinet or rack according to claim 4, wherein the electrically conducting frame structure includes four equally long vertical ledges and four equally long depth edges, which form the opposite lying sides of the switch cabinet or rack, whereby on a mounting side of the vertical ledges, the vertical ledges have a system of mounting recesses at a regular distance from one another, and whereby plurality of the mounting chassis are attached to the opposite lying ends of the switch cabinet or rack.

6. The switch cabinet or rack according to claim 3, wherein the electrically conducting frame structure includes four equally long vertical ledges and four equally long depth edges, which form the opposite lying sides of the switch cabinet or rack, whereby on a mounting side of the vertical ledges, the vertical ledges have a system of mounting recesses at a regular distance from one another, and whereby the plurality of mounting chassis are attached to the opposite lying ends of the switch cabinet or rack.

7. The switch cabinet or rack according to claim 2, wherein the electrically conducting frame structure includes four equally long vertical ledges and four equally long depth edges, which form the opposite lying sides of the switch cabinet or rack, whereby on a mounting side of the vertical ledges, the vertical ledges have a system of mounting recesses at a regular distance from one another, and whereby the plurality of mounting chassis are attached to the opposite lying ends of the switch cabinet or rack.

8. The switch cabinet and or rack according to claim 1, in which the slot ground contact has an electric conducting contact plate with a fastening section, through which the contact plate is attached electrically to a corresponding one of the plurality of mounting chassis, whereby the contact plate also has a free end, which is mechanically movable against the fastening section and which has a contact claw for electrical contact to the unit ground contact of the one of the energy storage units.

9. The switch cabinet or rack according to claim 8, in which each one of the energy storage unit slots has a pause position, which is configured to set the completely slid-in position of the one of the electrical energy storage units, whereby in the pause position, the free end of the contact plate abuts the contact claw of the unit ground contact of the one of the plurality of energy storage units.

10. The switch cabinet or rack according to claim 1, in which the electrically conducting frame structure is made of unlacquered, electrically conducting ledges, or of unlacquered, electrically conducting coated ledges.

11. A switch rack or rack set up including the switch cabinet or rack of claim 1 and the electrical energy storage units, whereby each of the electrical energy storage units have on opposite sides in each case a fastening flange stretching in the depth direction of each of the electrical energy storage units, through which each of the electrical energy storage units in each case are slid in on the grooves set up on the opposite lying sides of the switch cabinet or rack at the same vertical height.

12. The switch cabinet or rack set up according to claim 11, wherein each one of the plurality of energy storage unit slots has a horizontal width, without consideration of the fastening flanges, corresponding to a horizontal width of the one of the electrical energy storage units.

13. A switchgear rack for a plurality of electrical energy storage units, the switchgear rack comprising:
   an electrically conducting frame structure;

a first plurality of mounting chassis mounted to, and in electrical contact with, the electrically conducting frame structure, the first plurality of mounting chassis are vertically spaced apart from each other and arranged in a first vertical column;

a first plurality of grooves, each one of the first plurality of grooves is defined between two vertically adjacent ones of the first plurality of mounting chassis;

a second plurality of mounting chassis mounted to, and in electrical contact with, the electrically conducting frame structure, the second plurality of mounting chassis are vertically spaced apart from each other and arranged in a second vertical column horizontally spaced apart from the first vertical column, each one of the second plurality of mounting chassis is aligned with a different one of the first plurality of mounting chassis;

a second plurality of grooves, each one of the second plurality of grooves is defined between two vertically adjacent ones of the second plurality of mounting chassis, each one of the second plurality of grooves is aligned with a different one of the first plurality of grooves;

a plurality of energy storage unit slots each configured to receive therein one of the plurality of electrical energy storage units, each one of the plurality of energy storage unit slots is defined between one of the first plurality of mounting chassis and an opposing one of the second plurality of mounting chassis; and a plurality of slot ground contacts, each one of the plurality of slot ground contacts is at a back end of, and in electrical contact with, a different one of the first plurality of mounting chassis, each one of the plurality of slot ground contacts is configured to be in electrical contact with a unit ground contact of the one of the plurality of electrical energy storage units seated in one of the plurality of energy storage unit slots to electrically connect the unit ground contact to the electrically conducting frame structure.

* * * * *